United States Patent [19]

Cline et al.

[11] 4,087,239

[45] May 2, 1978

[54] APPARATUS FOR IMPARTING COMBINED CENTROSYMMETRIC AND NONCENTRO-SYMMETRIC ROTATION TO SEMICONDUCTOR BODIES

[75] Inventors: Harvey E. Cline; Thomas R. Anthony, both of Schenectady, N.Y.

[73] Assignee: General Electric Company, Schenectady, N.Y.

[21] Appl. No.: 733,239

[22] Filed: Oct. 18, 1976

[51] Int. Cl.² .............................................. F27B 9/14
[52] U.S. Cl. ...................................... 432/124; 432/45; 432/258; 148/1.5; 74/801; 165/47; 165/80; 269/57
[58] Field of Search ............... 74/801, 750 R; 165/47, 165/80, DIG. 8; 269/61, 57; 432/124, 125, 253, 258, 259, 81, 45; 148/1.5

[56] References Cited

U.S. PATENT DOCUMENTS

| | | | |
|---|---|---|---|
| 2,311,942 | 2/1943 | Hagemeyer | 432/259 |
| 3,081,648 | 3/1963 | Duer | 74/801 |
| 3,422,704 | 1/1969 | Catlett | 74/801 |
| 3,697,722 | 10/1972 | Furuichi et al. | 432/45 |
| 3,904,442 | 9/1975 | Anthony et al. | 148/1.5 |
| 3,971,875 | 7/1976 | Regalbuto | 432/253 |
| 4,012,236 | 3/1977 | Anthony et al. | 148/1.5 |

Primary Examiner—John J. Camby
Assistant Examiner—Henry C. Yuen
Attorney, Agent, or Firm—Donald M. Winegar; Joseph T. Cohen; Jerome C. Squillaro

[57] ABSTRACT

An apparatus for imparting combined centro-symmetric and noncentro-symmetric rotation to semiconductor bodies comprises a liquid-cooled sun gear, a stationary liquid-cooled ring gear coaxial with and radially spaced outwardly from the sun gear, and at least one planet gear disposed between and driven in engagement with the sun and ring gears. Means are provided for supporting a semiconductor body on each of the planet gears while minimizing the conduction of heat from the semiconductor body to the planet gear. Means are also provided for guiding a semiconductor body onto the supporting means and centering the semiconductor body on the planet gear. Thermal distortion of the apparatus is minimized when heated to extreme temperatures making the apparatus ideally suited for processing the semiconductor bodies with heat as in processing by temperature gradient zone melting.

29 Claims, 4 Drawing Figures

APPARATUS FOR IMPARTING COMBINED CENTROSYMMETRIC AND NONCENTRO-SYMMETRIC ROTATION TO SEMICONDUCTOR BODIES

CROSS REFERENCES

This invention is related to U.S. Patent Application Ser. No. 733,238, filed of even date herewith in the names of Harvey E. Cline and Thomas R. Anthony and Entitled "Uniform Thermomigration Utilizing Sample Movement." This application is assigned to the assignee of the present invention and discloses and claims a thermomigration process for manufacturing semiconductor devices wherein the devices are either rotated centrosymmetrically, rotated noncentro-symmetrically, translated, translated while being rotated noncentro-symmetrically or translated while being rotated centro-symmetrically.

BACKGROUND OF THE INVENTION

This invention relates to an apparatus for imparting a combined centro-symmetric and noncentro-symmetric rotation to semiconductor bodies during the processing thereof by heating as in processing by temperature gradient zone melting.

DESCRIPTION OF THE PRIOR ART

In the manufacture of semiconductor devices, it is often necessary to alter or tailor the conductivity type of a body of semiconductor material. This alteration is achieved by distributing atoms of a conductivity modifying dopant in a selected region or selected regions of the body. Frequently, techniques employed to achieve that distribution require the heating of the semiconductor body.

Recently, it has been discovered that a preferred technique of altering the conductivity of a semiconductor body is the technique of temperature gradient zone melting. Early teachings of temperature gradient zone melting are found in U.S. Pat. No. 2,813,048 issued to W. G. Pfann and in a book by Pfann entitled "Zone Melting" (John Wiley and Sons, Inc., 1966). More recent applications of temperature gradient zone melting are disclosed and claimed in U.S. Pat. Nos. 3,899,361 and 3,899,362 to Thomas R. Anthony and Harvey E. Cline and assigned to the assignee of the present invention. The aforementioned U.S. Patents to Anthony and Cline are incorporated herein by reference. As taught in the aforementioned book by Pfann, temperature gradient zone melting involves the migration of a melt of a first material through a body of a second material under the influence of a temperature gradient maintained across the second material, and finally a recrystallization of the melt after migration. In the application of temperature gradient zone melting to the production of semiconductor devices, the first material usually comprises a metal such as aluminum, tin-aluminum alloy or gold-antimony alloy while the second material comprises a semiconductor material such as silicon, germanium or the like.

Critical to the successful implementation of temperature gradient zone melting in the manufacture of semiconductor devices is the maintenance of a unidirectional temperature gradient across the semiconductor material. That is, for any desired direction of migration of the conductivity altering dopant through a body or wafer of semiconductor material, a temperature gradient across the body of semiconductor material should be established as closely as possible to the same direction. Presently, in the production of semiconductor devices by temperature gradient zone melting, this preferred direction of migration and thus of the required temperature gradient is normal to the major surfaces of the body or wafer. The existence of temperature gradients in any other direction (lateral or oblique to the major surfaces of the wafer) will cause the migration of the conductivity altering material in these other directions thereby causing the resulting doped zone to be irregular or misdirected, thus adversely effecting the performance of the device.

One source of radiant energy which is presently being employed in practicing temperature gradient zone melting is quartz lamps having tungsten filaments. A heat source may comprise a plurality of such lamps oriented in a parallel array. However, due to the construction of the lamps and spacing of the lamps from each other within an array, temperature irregularities as great at 40° C over distances of approximately 1 cm have been observed in the area of illumination of such an array. Such temperature irregularities contribute to the aforementioned lateral or oblique temperature gradients and thereby adversely affect the device being manufactured.

Direct observation of such an array of quartz lamps when energized has indicated that the temperature irregularities stemming from the construction of the lamps are due to a self shadowing of the coiled tungsten filament, the shadowing of the disc shaped filaments holders disposed within the quarts envelope, and the refractive properties of the quartz envelopes. The spacing of the lamps and thus the tungsten filaments within the array also contributes to the irregularities in temperature of the radiation emitted by the lamps.

It has been discovered that the adverse effects of these lateral or oblique gradients can be minimized to the point of insignificance by a combined centro-symmetric and noncentrosymmetric rotation of the semiconductor bodies while the bodies are being heated. Such a combined centro-symmetric and noncentrosymmetric or planetary movement causes all points on the semiconductor bodies to experience a multiplicity of temperature irregularities, these irregularities occurring over substantial portions of the area illuminated by the lamp array. The movement of the semiconductor bodies is rapid enough so that each temperature irregularity will be experienced by a point on a semiconductor body for only a brief period of time. Therefore, each temperature irregularity experienced by a semiconductor body will only cause a very slight wiggle or deflection in the melt zone. It has further been discovered that the exposure of the semiconductor bodies to many random irregularities for only brief periods of time has the effect of each irregularity or lateral temperature gradient due thereto to be effectively cancelled by an opposing temperature irregularity or lateral temperature gradient. Therefore, each wiggle or deflection in the melt zone is cancelled by a wiggle or deflection in an opposite direction giving the edges of each melt zone an extremely fine saw tooth configuration. This saw tooth configuration is so fine, that no adverse effects result therefrom and the devices produced by this method are characterized by abrupt, well defined junctions. This method of centro-symmetrically and noncentro-symmetrically rotating semiconductor bodies while being heated in a temperature gradient zone melting process is disclosed and claimed in U.S. Patent Application Ser. No. 645,675, now U.S. Pat. No. 4,012,236 filed Dec. 31, 1975 in the names of Thomas R. Anthony and Harvey E. Cline and assigned to the assignee of the present invention. This application is incorporated herein by reference.

Temperature gradient zone melting may be carried on at temperatures from about 1000° to about 1400° C to achieve a desired temperature gradient and migration rate. To impart such a motion to the semiconductor bodies during the heating thereof necessarily requires a somewhat complex mechanical movement. Such a movement in turn requires the precise relative orientation, engagement and interaction of operating mechanical members. However, the extreme temperatures encountered in a temperature gradient zone melting process would cause most materials from which such members would normally be formed, i.e. steel, aluminum and the like, to readily melt. Even if melting could be prevented, such extreme temperatures could cause thermal expansions and thus distortions of the members employed in the mechanical movement obviating the precise engagement, relative orientation and interaction of these members and therefore causing failure of the mechanical movement.

It is therefore, an object of this invention to provide a new and improved apparatus for imparting a combined centro-symmetric and noncentro-symmetric rotation to semiconductor bodies undergoing processing by heating.

It is another object of this invention to provide a new and improved apparatus for imparting a combined centro-symmetric and noncentro-symmetric rotation to semiconductor bodies undergoing processing by thermal gradient zone melting wherein any overall misdirection of a melt zone due to lateral temperature gradients is minimized.

It is another object of the present invention to provide a new and improved apparatus for imparting a combined centro-symmetric and noncentro-symmetric rotation to semiconductor bodies undergoing processing by temperature gradient zone melting which apparatus can withstand extreme temperatures encountered in such processing.

SUMMARY OF THE INVENTION

These and other objects apparent from the following detailed description taken in connection with the appended claims and the accompanying drawings are attained by providing a new and improved apparatus for imparting a combined centro-symmetric and non-centro-symmetric rotation to a plurality of semiconductor bodies, which apparatus includes a liquid-cooled sun gear, a stationary liquid-cooled ring gear coaxial with and radially spaced outwardly from said sun gear, and at least one planet gear disposed between and in driven engagement with said sun and ring gears. The teeth of both the sun gear and ring gear comprise pins which are in threaded engagement with a liquid cooled base or body member. The liquid cooled base forms a heat sink to enhance the temperature gradient impressed across the semi-conductor bodies by a heat source. The planet gears are annular in shape allowing the semiconductor bodies supported thereon to radiate to the heat sink. Means are provided on each planet gear for supporting a semiconductor body thereon while restricting the conduction of heat from the semiconductor body to the planet gear. Means are also provided for guiding the semiconductor bodies onto the supporting means and centering the semiconductor bodies on the planet gears. For purposes such as for example, the loading and unloading of semiconductor bodies from the apparatus of the present invention, means are provided to indicate a predetermined position of the planet gears. This indicating means includes a signaling means, a sensing means and a shutter synchronized with the sun gear and disposed between the signaling and sensing means, the shutter being arranged to allow a signal from the signaling means to be received by the sensing means only upon a predetermined position of the sun and planet gears.

DESCRIPTION OF THE PREFERRED EMBODIMENT

Figure 1:
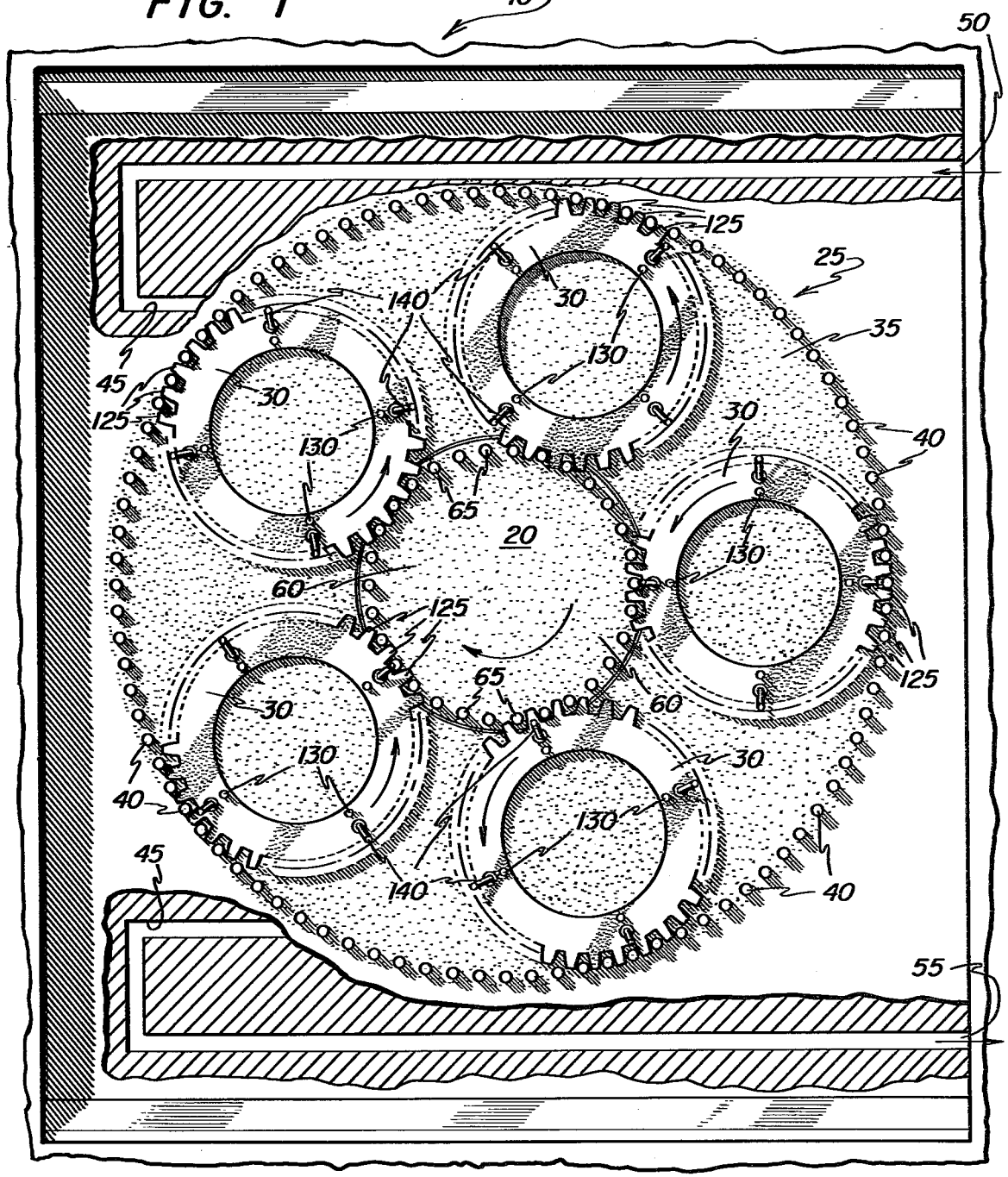
FIG. 1 is a top plan view partially sectioned and broken away of the apparatus of the present invention.
Figure 2:
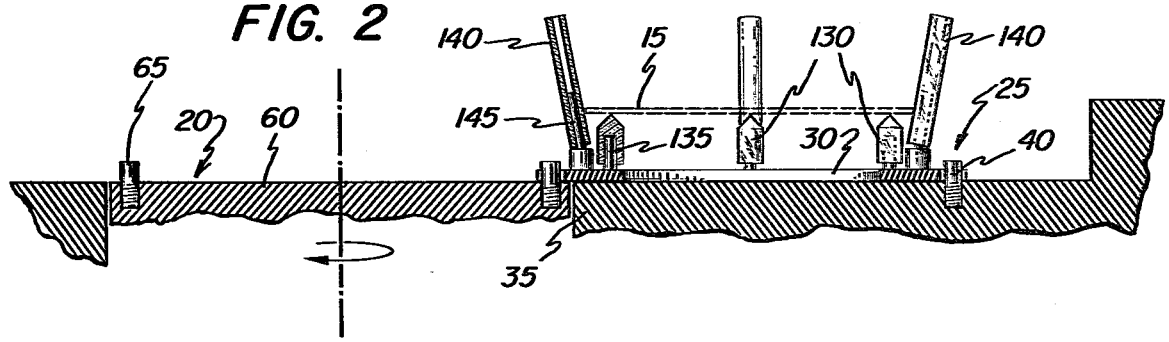
FIG. 2 is a side view partially sectioned and broken away of the apparatus of the present invention.

Referring to FIGS. 1 and 2, there is shown an apparatus 10 for imparting a combined centro-symmetric and noncentro-symmetric rotation to a plurality of semiconductor bodies, one of which is shown in phantom lines at 15 (FIG. 2) while the bodies are undergoing heating such as for example during a temperature gradient zone melting process. Apparatus 10 comprises a sun gear 20, a stationary ring gear 25 coaxial with and radially spaced outwardly from the sun gear, and a plurality of planet gears 30 disposed between and in driven engagement with the sun and ring gears. Ring gear 25 comprises a base 35 having a plurality of first pins 40 fixed thereto as by a threaded engagement therewith. Base 35 also provides a supporting surface for the planet gears.

During temperature gradient zone melting, temperatures as high as 1400° may be experienced by the semiconductor bodies and any supports for these bodies due to the thermal radiation emitted by a suitable heat source (not shown) disposed above apparatus 10. Therefore, any apparatus used to move the semiconductor bodies while the bodies are being processed, must be capable of withstanding the heat associated with such extreme temperatures. To ensure that ring gear 25 will be able to withstand this heating and maintain its shape, base 35 is provided with a subsurface coolant channel 45 adapted to be connected to a source of liquid coolant (not shown) at 50 and a drain for liquid coolant (not shown) at 55. While subsurface coolant channel 45 is shown in a generally surpentine configuration, it will be understood that any other suitable arrangement may be employed. A flow of liquid coolant through coolant passage 45 substantially eliminate any thermal expansion or distortion of base 35 thereby maintaining constant the spacing between each of first pins 40. The threaded engagement between first pins 40 and base 35 provides a large area of contact between these numbers, ensuring the cooling of first pins 40 by conduction of heat therethrough to liquid cooled base 35.

Figure 3:
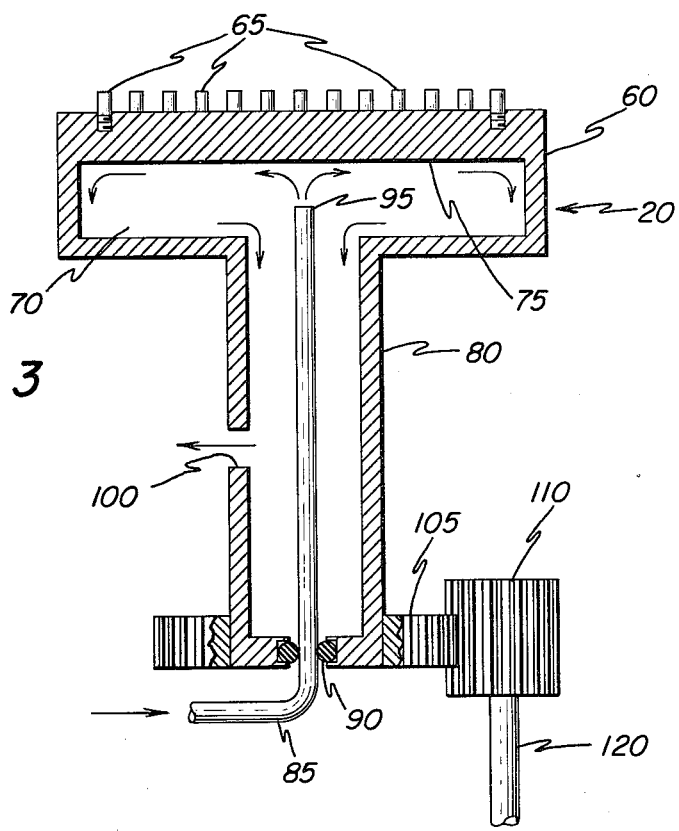
FIG. 3 is a side view partially sectioned and broken away of the sun gear employed in the apparatus of the present invention, means for liquid cooling the sun gear and means for driving the sun gear.

Referring now to FIGS. 1, 2 and 3, sun gear 20 comprises a body member 60 having a circular disposition of a plurality of second pins 65 fixed thereto. Second pins 65 are fixed to body member 60 by a threaded engagement therewith to maximize the area of thermal contact between these members. Referring particularly to FIG. 3, body member 60 of sun gear 20 is provided with a cavity 70 in the interior thereof, cavity 70 being partially defined by major surface 75. A hollow shaft 80 is fixed to body member 60 the hollow interior of which is in fluid communication with cavity 70 at the central axis of sun gear 20. A liquid coolant supply tube 85 adapted to be connected to a suitable supply of coolant (not shown) extends through hollow shaft 80 and is sealed therefrom at 90. Liquid coolant supply tube 85 includes an outlet 95 in proximity to major surface 75 of body portion 60. To cool body member 60, a flow of liquid coolant is directed against major surface 75 by supply tube 85 at outlet 95. The liquid coolant is collected in cavity 70 and hollow shaft 80 draining therefrom through a drain orifice 100. The cooling of body member 60 ensures the maintenance of relatively constant spacing between second pins 65 and prevents any thermal expansion or distortion of sun gear 20 due to the heat associated with the extreme temperatures encountered in the temperature gradient zone melting process. Hollow shaft 80 has fixed thereto a gear 105. This gear 105 mates with gear 110 which is driven by a motor 115 through shaft 120 (see FIG. 4).

Each of planet gears 30 comprises an annulus having a plurality of gear teeth 125 disposed on the outer periphery thereof. Planet gears 30 are annular to allow the radiation of heat through the hollow centers thereof from semiconductor bodies 15 to base 35 which performs as a heat sink to enhance the temperature gradient across the semiconductor bodies.

To support semiconductor bodies 15 on planet gears 30, each of planet gears 30 is provided with a plurality of first refractory pins 130 each seated on a corresponding third pin 135 fixed to the planet gear. First refractory pins 130 are pointed at a location of contact with semiconductor bodies 15 to minimize thermal conduction between the semiconductor body and the planet gear. Such conduction could create a lateral temperature gradient adversely affecting the direction of migration of any melt zone in that area.

In the preferred embodiment illustrated here, semiconductor bodies 15 may be dropped onto first refractory pins 130 from a suitable loader (not shown) disposed above the refractory pins. To guide semiconductor bodies 15 onto first refractory pins 130 so as to center semiconductor body 15 on the corresponding planet gear, each planet gear is provided with a plurality of second refractory pins 140 each seated on a corresponding fourth pin 145 fixed to planet gear 30. Second refractory pins 140 make an acute angle with portions of a major surface of the planet gear disposed radially outwardly therefrom. A semiconductor body 15 which is off-center with respect to a corresponding planet gear when dropped thereon will engage second refractory pins 140 and slide therealong centering itself on first refractory pins 130 and planet gear 30. Second refractory pins 140 also ensure that the semiconductor bodies will remain centered with respect to the planet gears during the combined centro-symmetric and noncentro-symmetric rotation of the bodies.

Figure 4:
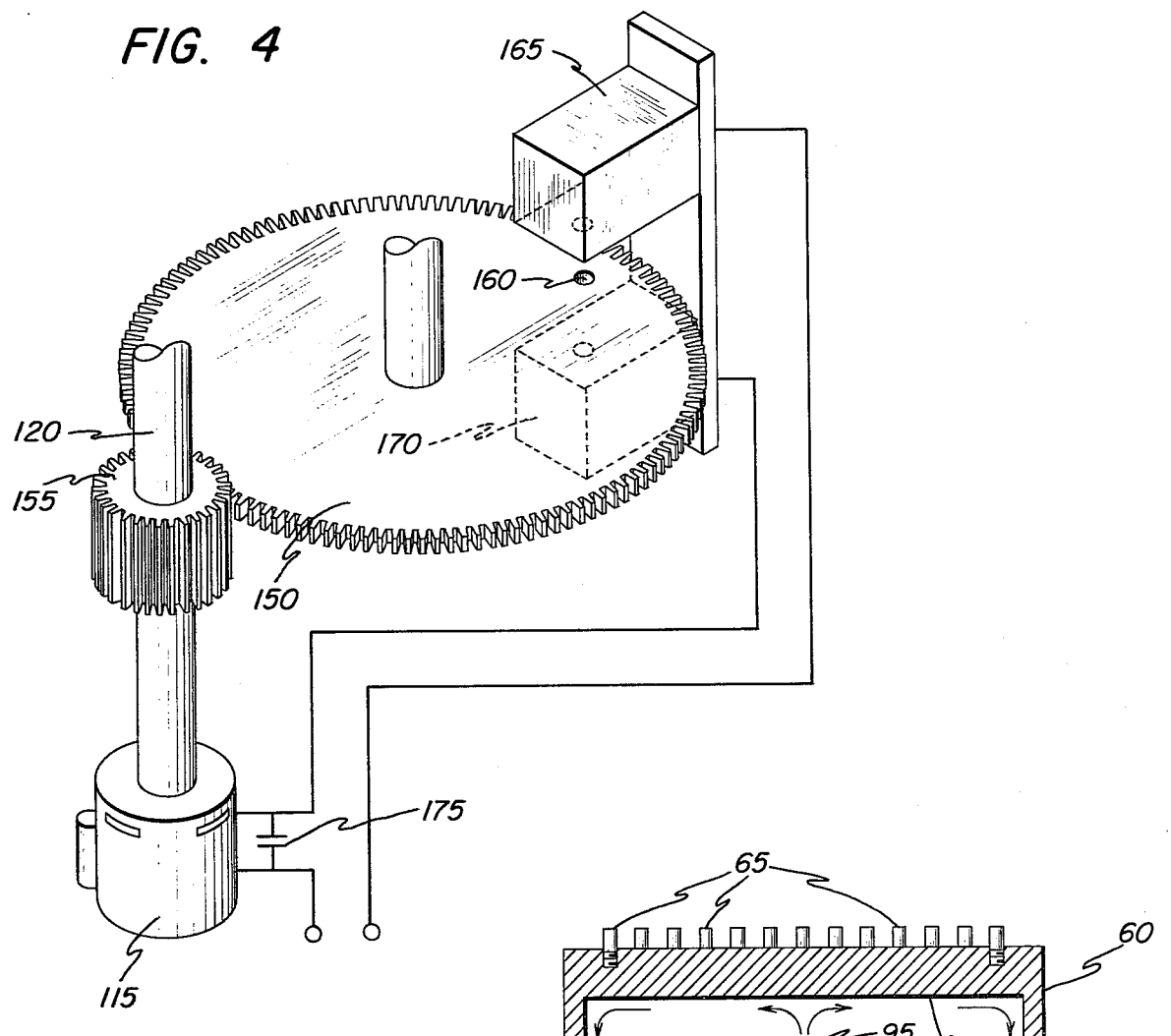
FIG. 4 is a three-dimensional view of means employed to indicate a predetermined position of the sun gear and planet gears of the apparatus of the present invention.

In employing the apparatus of the present invention in the practice of temperature gradient zone melting, it is desirable to be able to determine when the sun and planet gears reach predetermined positions so that the rotations of these semiconductor bodies may be terminated. This is particularly useful to ensure that the planet gears will be aligned with any means (not shown) provided for lifting the semiconductor bodies from the planet gears upon the termination of the processing. A means for indicating a predetermined position of the planet gears so that the rotation of the semiconductor bodies may be terminated is illustrated in FIG. 4. Motor 115 which drives sun gear 20 through shaft 120 also drives a gear or shutter 150 through gear 155 fixed to shaft 120. Shutter 150 is provided with an aperture 160 extending completely therethrough. A signalling means 165 is disposed adjacent to one side of shutter 150 while a signal sensing means 170 is disposed adjacent to the opposite side of shutter 150. The shutter aperture is disposed a distance from the axis of rotation of shutter 150 equal to the distance from that axis at which signaling means 165 and sensing means 170 are disposed. Therefore, with each revolution of shutter 150 a signal such as a light beam emitted by signaling means 165 will pass through the aperture 160, shutter 150 and be sensed by sensing means 170. The rotation of shutter 150 may be synchronized with the rotation of sun gear 20 so that the aperture will be rotated into alignment with the signaling and sensing means each time the sun gear has completed one revolution. As illustrated here, signaling and sensing means 165 and 170 respectively may comprise a normally open electrical switch. Upon the alignment of the aperture with the signaling and sensing means, the switch would open thereby disconnecting motor 115 from a suitable power supply to stop the combined centro-symmetric and noncentro-symmetric rotation of the semiconductor bodies. Normally open contacts 175 may be used to restart motor 115 after the processed semiconductor bodies have been replaced by unprocessed semiconductor bodies. It has been found that a suitable optical switch is sold by Monsanto Company and designated as a Slotted Optical Limit Switch Model MCA8 or MCA81 wherein the signaling means comprises an infrared light-emitting diode and the sensing means comprises a silicon photodarlington.

In the preferred embodiment, base 35 and body member 60 are formed from aluminum which is relatively easy to machine while having a relatively high thermal conductivity. The pins forming the gear teeth of the sun and ring gears may be formed from stainless steel, nickel or alloys thereof or any other structurally suitable material. In the preferred embodiment, planet gears 30 and third and fourth pins 135 and 145 are formed from nickel or alloys thereof. Base 35 and body member 60 may be coated with a radiation absorbing coating to enhance the temperature gradient maintained across the semiconductor bodies. Carbon has been found to be well suited for this application. First and second refractory pins 130 and 140 respectively are of quartz.

In operation, motor 115 is energized by actuation of normally open contacts 175 driving shaft 120, gears 110 and 105 and sun gear 20. The rotation of sun gear 20 and the engagement of planet gears 30 with sun and ring gears 20 and 25 respectively causes planet gears 30 to rotate both about their own axes and the axis of the sun gear. A flow of coolant through base 35 and body member 60 prevents any thermal expansion or distortion of the sun and ring gears while providing a suitable heat sink to enhance the temperature gradient across the semiconductor bodies. After sun gear 20 and planet gears 30 have completed a required amount of revolutions, aperture 160 in shutter 150 will provide communication between signaling means 165 and sensing means 170. If the signaling and sensing means are employed in a normally open switch, the power to motor 115 will be shut off terminating the rotation of sun gear 20 and planet gears 30 and allowing the replacement of processed semiconductor bodies with unprocessed bodies. Actuation of contacts 175 energizing motor 115 will restart the cycle.

The apparatus of the present invention provides an effective means for imparting a combined centro-symmetric and noncentro-symmetric rotation to a plurality of semiconductor bodies for the minimization of transverse or lateral temperature gradients impressed across the bodies during temperature gradient zone melting processing. The liquid cooling of the base and the sun gear enhances the desired temperature gradient while enabling the apparatus to withstand the extreme temperature associated with the temperature gradient zone melting process. The precise registry of the semiconductor bodies with the supports therefor is ensured during loading, unloading or rotation of the bodies. Conduction of heat from the semiconductor bodies to the base is minimized to further enhance the desired temperature gradient.

While there has been shown and described a specific embodiment of the apparatus of the present invention it will be apparent to those skilled in the art that modifications may be made without departing from the substance of this invention and it is intended by the appended claims to cover such modifications as come within the spirit and scope of this invention.

What is claimed is:

1. An apparatus for imparting combined centro-symmetric and noncentro-symmetric rotation to at least one body of semiconductor material during processing thereof by heating, said apparatus comprising:
    a sun gear adapted to be rotatably driven;
    a ring gear coaxial with and radially spaced outwardly from said sun gear;
    at least one planet gear disposed between and in driven engagement with said sun and ring gears;
    a base, said base being co-planar with said sun gear and providing a support for each of said planet gears;
    the gear teeth of said ring gear comprising a multiplicity of first pins fixed to and upstanding from said base, said first pins being disposed in a circular arrangement around said sun gear, and
    means for supporting a semiconductor body on each such planet gear, and restricting the conduction of heat from said semiconductor body to each such planet gear.

2. The apparatus of claim 1 wherein said first pins are fixed to said base by a threaded engagement therewith.

3. The apparatus of claim 1 wherein said base includes an internal coolant passage adapted for connection to a source and drain of liquid coolant.

4. The apparatus of claim 3 wherein said base is aluminum.

5. The apparatus of claim 3 wherein said base is coated with a radiation absorbant coating.

6. The apparatus of claim 5 wherein said radiation absorbant coating comprises carbon.

7. The apparatus of claim 3 wherein each planet gear comprises an annulus with a plurality of gear teeth disposed on the outer periphery thereof.

8. The apparatus of claim 1 wherein said means for supporting a semiconductor body on each of said planet gears comprises a plurality of first refractory pins supported on and upstanding from each of said planet gears.

9. The apparatus of claim 8 and further including a plurality of third pins fixed to and upstanding from each of said planet gears, each of said first refractory pins being seated on a corresponding one of said third pins.

10. The apparatus of claim 9 wherein the material of said planet gears and said third pins comprises nickel.

11. The apparatus of claim 8 wherein said first refractory pins are of quartz.

12. The apparatus of claim 8 wherein said refractory pins are pointed on ends adapted to contact said semiconductor bodies.

13. The apparatus of claim 1 and further including means disposed on said planet gears for guiding said semiconductor bodies onto said supporting means and centering said semiconductor bodies on said planet gears.

14. The apparatus of claim 13 wherein said guiding and centering means comprises a plurality of second refractory pins supported on each of said planet gears and making an acute angle with a portion of a major surface of said planet gear disposed radially outward from said second refractory pins, said second refractory pins being disposed radially outwardly from said supporting means.

15. The apparatus of claim 14 and further including a plurality of fourth pins fixed to and upstanding from each of said planet gears, each of said second refractory pins being seated on a corresponding one of said fourth pins.

16. The apparatus of claim 15 wherein said fourth pins are of nickel.

17. The apparatus of claim 14 wherein said second refractory pins are of quartz.

18. The apparatus of claim 1 and further including means for indicating a predetermined position of said planet gears, said indicating means comprising:
    signaling means;
    sensing means and
    a rotatable shutter, the rotation of said shutter being synchronized with said sun gear and disposed between said signaling and sensing means said shutter being constructed and arranged to allow a signal from said signaling means to be received by said sensing means only upon the location of said sun gear in a predetermined position.

19. The apparatus of claim 18 wherein said signaling and sensing means comprise an optical switch.

20. The apparatus of claim 18 wherein said shutter comprises a gear driven with said sun gear and having an aperture therein said aperture allowing the reception by said receiving means of a said signaling means upon a predetermined orientation of said sun gear.

21. The apparatus of claim 1 wherein said sun gear comprises:
    a body member and
    a multiplicity of gear teeth disposed in a circular arrangement about the axis of rotation of said sun gear, each of said gear teeth comprising a second pin fixed to and upstanding from said body member.

22. The apparatus of claim 21 wherein said second pins are fixed to said body member by threaded engagement therewith.

23. The apparatus of claim 21 and further including means for cooling said sun gear, said cooling means comprising:
  means for introducing liquid coolant into contact with a major surface of said body member and
  means for draining liquid coolant from contact with said major surface of said body member.

24. The apparatus of claim 23 wherein said means for introducing liquid coolant comprises a liquid coolant supply tube adapted for connection to a source of liquid coolant, said liquid coolant supply tube having an outlet in proximity to said major surface of said body member and so constructed and arranged as to direct a flow of liquid coolant from said outlet against said major surface of said body member.

25. The apparatus of claim 23 wherein said means for draining liquid coolant from said major surface of said body member comprises:
  a cavity in the interior of said body member, said cavity being partially defined by said major surface of said body member and adapted to collect liquid coolant which has been directed against said major surface of said body member and
  a drain orifice disposed in fluid communication with said cavity, coolant collected in said cavity being drained from said sun gear through said drain orifice.

26. The apparatus of claim 25 and further including a hollow shaft coaxial with and fixed to said body member, said liquid supply tube extending through said hollow shaft along the central axis thereof and said liquid drain orifice being disposed in said hollow shaft.

27. The apparatus of claim 21 wherein said body member is coated with a radiation absorbant coating.

28. The apparatus of claim 27 wherein the material of said radiation absorbant coating comprises carbon.

29. The apparatus of claim 21 wherein said body member is made of aluminum.

* * * * *